(12) United States Patent
Hemink et al.

(10) Patent No.: US 7,355,888 B2
(45) Date of Patent: Apr. 8, 2008

(54) APPARATUS FOR PROGRAMMING NON-VOLATILE MEMORY WITH REDUCED PROGRAM DISTURB USING MODIFIED PASS VOLTAGES

(75) Inventors: Gerrit Jan Hemink, Yokohama (JP); Ken Oowada, Kanagawa (JP)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/312,925

(22) Filed: Dec. 19, 2005

(65) Prior Publication Data

US 2007/0171718 A1     Jul. 26, 2007

(51) Int. Cl.
  *G11C 11/34*  (2006.01)
(52) U.S. Cl. .............. 365/185.17; 365/185.27; 365/185.11
(58) Field of Classification Search ........... 365/185.17, 365/185.27, 185.11, 184.18
  See application file for complete search history.

(56) References Cited

U.S. PATENT DOCUMENTS

| | | | |
|---|---|---|---|
| 5,043,940 A | 8/1991 | Harari | |
| 5,172,338 A | 12/1992 | Mehrotra et al. | |
| 5,386,422 A | 1/1995 | Endoh | |
| 5,522,580 A | 6/1996 | Varner, Jr. | |
| 5,570,315 A | 10/1996 | Tanaka | |
| 5,621,684 A * | 4/1997 | Jung | 365/185.17 |
| 5,677,873 A | 10/1997 | Choi et al. | |
| 5,715,194 A | 2/1998 | Hu | |
| 5,774,397 A | 6/1998 | Endoh et al. | |
| 5,818,757 A | 10/1998 | So et al. | |
| 5,887,145 A | 3/1999 | Harari et al. | |
| 5,973,962 A | 10/1999 | Kwon | |
| 5,991,202 A | 11/1999 | Derhacobian et al. | |
| 6,011,287 A | 1/2000 | Itoh et al. | |
| 6,046,935 A | 4/2000 | Takeuchi et al. | |
| 6,049,494 A | 4/2000 | Sakui et al. | |
| 6,061,270 A | 5/2000 | Choi | |
| 6,107,658 A | 8/2000 | Itoh et al. | |
| 6,181,599 B1 | 1/2001 | Gongwer | |
| 6,222,762 B1 | 4/2001 | Guterman | |

(Continued)

OTHER PUBLICATIONS

S. Aritome et al., "Reliability Issues of Flash Memory Cells," Proceedings of the IEEE, New York, vol. 81, No. 5, May 1, 1993, pp. 776-788.

(Continued)

*Primary Examiner*—Tuan T. Nguyen
*Assistant Examiner*—Han Yang
(74) *Attorney, Agent, or Firm*—Vierra Magen Marcus & DeNiro LLP

(57) ABSTRACT

Non-volatile storage elements are programmed in a manner that reduces program disturb by using modified pass voltages. In particular, during the programming of a selected storage element associated with a selected word line, a higher pass voltage is applied to word lines associated with previously programmed non-volatile storage elements in the set than to word lines associated with unprogrammed and/or partly programmed non-volatile storage elements in the set. The pass voltage is sufficiently high to balance the channel potentials on the source and drain sides of the selected word line and/or to reduce leakage of charge between the boosted channel regions. Optionally, an isolation region is formed between the boosted channel regions by applying a reduced voltage on one or more word lines between the selected word line and the word lines that receive the higher pass voltage.

21 Claims, 9 Drawing Sheets

U.S. PATENT DOCUMENTS

| | | |
|---|---|---|
| 6,456,528 B1 | 9/2002 | Chen |
| 6,522,580 B2 | 2/2003 | Chen et al. |
| 6,525,964 B2 | 2/2003 | Tanaka et al. |
| 6,614,688 B2 | 9/2003 | Yeom et al. |
| 6,859,395 B2 * | 2/2005 | Matsunaga et al. .... 365/185.18 |
| 6,859,397 B2 | 2/2005 | Lutze et al. |
| 6,987,694 B2 * | 1/2006 | Lee ...................... 365/185.17 |
| 7,046,568 B2 | 5/2006 | Cernea |
| 7,061,807 B2 * | 6/2006 | Tanaka et al. ......... 365/185.18 |
| 7,099,193 B2 * | 8/2006 | Futatsuyama .......... 365/185.17 |
| 7,161,833 B2 * | 1/2007 | Hemink ................. 365/185.18 |
| 7,184,309 B2 * | 2/2007 | Matsunaga et al. .... 365/185.17 |
| 7,196,928 B2 | 3/2007 | Chen |
| 2002/0110019 A1 | 8/2002 | Satoh et al. |
| 2002/0126532 A1 | 9/2002 | Matsunaga et al. |
| 2003/0147278 A1 | 8/2003 | Tanaka et al. |
| 2004/0057287 A1 | 3/2004 | Cernea |
| 2004/0105308 A1 | 6/2004 | Matsunaga |
| 2004/0109357 A1 | 6/2004 | Cernea |
| 2004/0255090 A1 | 12/2004 | Guterman |
| 2005/0024939 A1 | 2/2005 | Chen |
| 2005/0174852 A1 | 8/2005 | Hemink |
| 2005/0226055 A1 | 10/2005 | Guteman |
| 2006/0126390 A1 | 6/2006 | Gorobets |
| 2006/0140007 A1 | 6/2006 | Cernea |
| 2006/0158947 A1 | 7/2006 | Chan |
| 2007/0047314 A1 * | 3/2007 | Goda et al. ............ 365/185.18 |
| 2007/0171719 A1 | 7/2007 | Hemink |

OTHER PUBLICATIONS

Jung, et al., "A 3.3V 128Mb Multi-Level NAND Flash Memory for Mass Storage Applications," ISSCC96, Session 2, Flash Memory, Paper TP 2.1, IEEE, pp. 32-33, slide supplement pp. 20-21, 346-347 (1996).

Jung, et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

A. Modelli et al., "Basic feasibility constraints for multilevel CHE-programmed flashmemories," IEE Trans. on Electron Devices, vol. 48, No. 9, Sep. 2001, pp. 2032-2042.

T. Nozaki, et al., "A 1-Mb EEPROM with MONOS Memory Cell for Semiconductor Disk Application," IEEE Journal of Solid-State Circuits, vol. 26, No. 4 Apr. 1991, pp. 497-501.

K.D. Suh, et al., "A 3.3V 32 Mb NAND Flash Memory with Incremental Step Pulse Programming Scheme," Journal of Solid-State Circuits, vol. 30, No. 11, Nov. 1995, pp. 1149-1155.

Office Action dated Mar. 23, 2007 in U.S. Appl. No. 11/313,023.

* cited by examiner

APPARATUS FOR PROGRAMMING NON-VOLATILE MEMORY WITH REDUCED PROGRAM DISTURB USING MODIFIED PASS VOLTAGES

CROSS-REFERENCE TO RELATED APPLICATIONS

This application is related to U.S. patent application Ser. No. 10/774,014, published as 2005/0174852 on Aug. 11, 2005, titled "Self-boosting system for flash memory cells", and incorporated herein by reference.

BACKGROUND OF THE INVENTION

1. Field of the Invention

The present invention relates to programming non-volatile memory with reduced program disturb.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{pgm}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{pgm}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{pgm}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

During programming of a selected memory element, neighboring memory elements may be inadvertently programmed in a process referred to as program disturb. For example, a memory element that is not meant to be programmed, but which is on the same word line as a memory element selected for programming, may become inadvertently programmed when $V_{pgm}$ is applied to the word line. Several techniques can be employed to prevent program disturb. For example, with self boosting, the channels associated with the unselected bit lines are electrically isolated and a pass voltage (e.g., 10 V) is applied to the word lines associated with the unselected memory elements during programming. The unselected word lines couple to the channels associated with the unselected bit lines, causing a voltage (e.g., 8 V) to exist in the channel of the unselected bit lines, which tends to reduce program disturb. Thus, self boosting causes a voltage boost to exist in the channel which tends to lower the voltage across the tunnel oxide and hence reduce program disturb. Furthermore, Local Self Boosting (LSB) and Erased Area Self Boosting (EASB) attempt to reduce program disturb by isolating the channel of previously programmed elements from the channel of the element being inhibited.

However, with ever decreasing channel lengths in memory elements, e.g., 90 nm or less, the ability of conventional channel boosting techniques to reduce program disturb is compromised. In particular, the channel length of the memory elements can become too short to sufficiently isolate the two separately boosted channel areas at the drain and source sides of the selected word line. As a result, the boosted channel voltage can be lowered, thereby worsening program disturb. Additionally, band-to-band tunneling or gate induced drain leakage (GIDL) related breakdown can occur near the drain of the grounded word line. Due to this breakdown, the boosted channel can be discharged, causing program disturb, and/or hot carriers may be generated that are injected in the tunnel oxides or into the floating gates of the memory cells. An apparatus which provides improved program disturb reduction is needed which addresses the above and other issues.

SUMMARY OF THE INVENTION

An apparatus is provided for programming non-volatile memory elements in which program disturb is reduced.

In one embodiment, an apparatus for programming non-volatile storage includes a set of non-volatile storage elements, and one or more managing circuits in communication with the set of non-volatile storage elements. The one or more managing circuits receive a request to program data, and, responsive to the request, program a selected non-volatile storage element in the set by applying a programming voltage on a selected word line. Additionally, during the programming, a higher pass voltage is applied to word lines associated with previously programmed non-volatile storage elements than to word lines associated with unprogrammed and/or partly programmed non-volatile storage elements. The pass voltages boost a potential of associated channel regions. In particular, the potential of the channel region associated with the previously programmed non-volatile storage elements is approximately balanced with the potential of the channel region associated with the unprogrammed and/or partly programmed non-volatile storage elements. As a result, the differential in the pass voltages reduces the leakage of charge from the channel region associated with the unprogrammed and/or partly programmed non-volatile storage elements to the channel region associated with the previously programmed non-volatile storage elements. Depending on the implementation, the differential in the pass voltages can be approximately two to three volts. Moreover, when the set of non-volatile storage elements is programmed starting at a source side and ending at a drain side, a higher pass voltage is applied to the source side word lines than to the drain side word lines.

In another embodiment, an apparatus for programming non-volatile storage programs a selected non-volatile storage element in a set of non-volatile storage elements by applying a programming voltage on a selected word line. Additionally, during the programming, pass voltages are applied to the word lines such that an isolation region is formed between previously programmed non-volatile storage elements and unprogrammed and/or partly programmed non-volatile storage elements.

DETAILED DESCRIPTION

Figure 1:
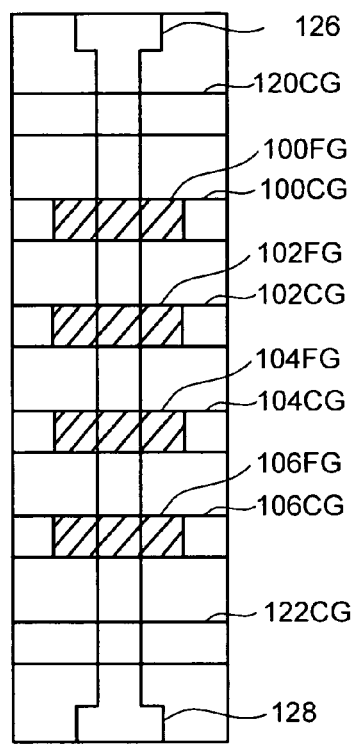
FIG. 1 is a top view of a NAND string.
Figure 2:
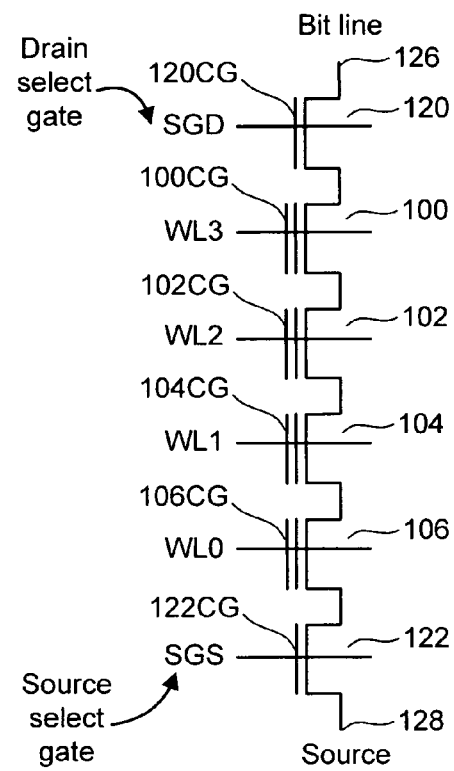
FIG. 2 is an equivalent circuit diagram of the NAND string of FIG. 1.

One example of a non-volatile memory system suitable for implementing the present invention uses the NAND flash memory structure, in which multiple transistors are arranged in series between two select gates in a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each memory cells or storage elements. In other designs, the memory elements may include multiple transistors or may be different than those depicted in FIGS. 1 and 2. Select gate 120 is connected to drain select line SGD, while select gate 122 is connected to source select line SGS.

Figure 3:
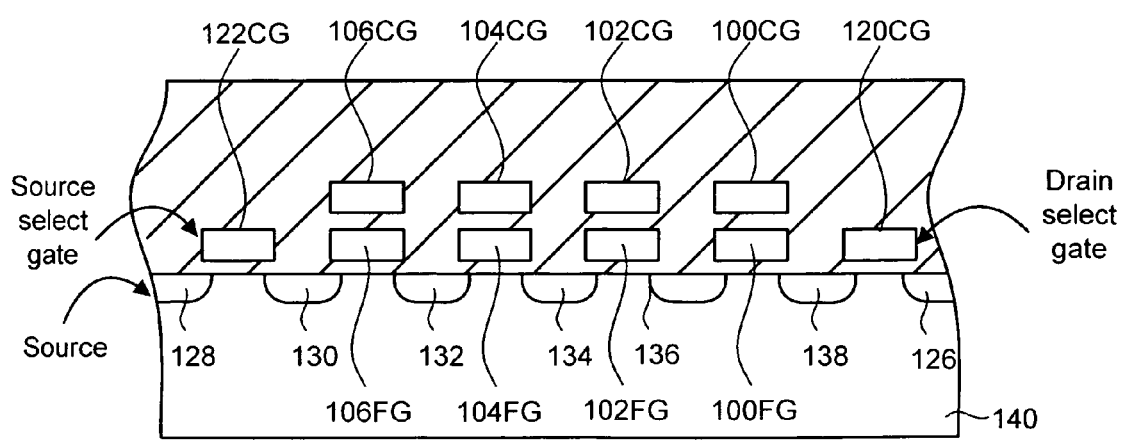
FIG. 3 is a cross-sectional view of the NAND string of FIG. 1.

FIG. 3 provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Generally, the invention can be used with devices that are programmed and erased by Fowler-Nordheim tunneling The invention is also applicable to devices that use a triple layer dielectric such as a dielectric formed of silicon oxide, silicon nitride and silicon oxide (ONO) to store charges instead of a floating gate. A triple layer dielectric formed of ONO is sandwiched between a conductive control gate and a surface of a semi-conductive substrate above the memory element channel. The invention can also be applied to devices that use, for example, small islands of conducting materials such as nano crystals as charge storage regions instead of floating gates. Such memory devices can be programmed and erased in a similar way as floating gate based NAND flash devices.

Figure 4:
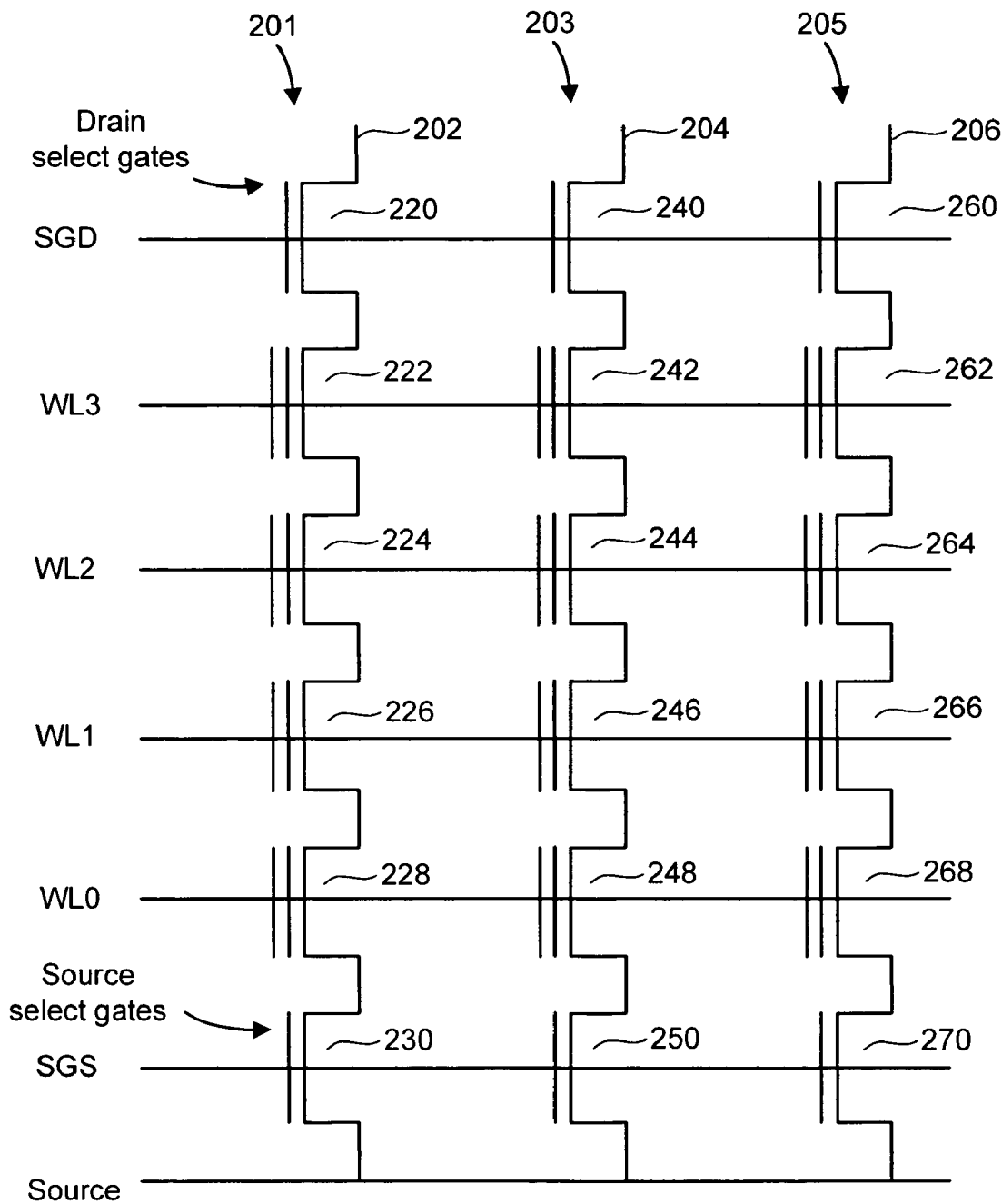
FIG. 4 is a circuit diagram depicting three NAND strings.

FIG. 4 is a circuit diagram depicting three NAND strings. A typical architecture for a flash memory system using a NAND structure will include several NAND strings. For example, three NAND strings 201, 203 and 205 are shown in a memory array having many more NAND strings. Each of the NAND strings includes two select transistors and four memory elements. For example, NAND string 201 includes select transistors 220 and 230, and memory elements 222, 224, 226 and 228. NAND string 203 includes select transistors 240 and 250, and memory elements 242, 244, 246 and 248. NAND string 205 includes select transistors 260 and 270, and memory elements 262, 264, 266 and 268. Each NAND string is connected to the source line by its select transistor (e.g., select transistor 230, 250 or 270). A selection line SGS is used to control the source side select gates. The various NAND strings 201, 203 and 205 are connected to respective bit lines 202, 204 and 206, by select transistors 220, 240, 260, etc., which are controlled by drain select line SGD. In other embodiments, the select lines do not necessarily need to be in common. Word line WL3 is connected to the control gates for memory elements 222, 242 and 262. Word line WL2 is connected to the control gates for memory elements 224, 244 and 264. Word line WL1 is connected to the control gates for memory elements 226, 246 and 266. Word line WL0 is connected to the control gates for memory elements 228, 248 and 268. As can be seen, each bit line and the respective NAND string comprise the columns of the array or set of memory elements. The word lines (WL3, WL2, WL1 and WL0) comprise the rows of the array or set. Each word line connects the control gates of each memory element in the row. For example, word line WL2 is connected to the control gates for memory elements 224, 244 and 264.

Each memory element can store data. For example, when storing one bit of digital data, the range of possible threshold voltages of the memory element is divided into two ranges which are assigned logical data "1" and "0." In one example of a NAND type flash memory, the voltage threshold is negative after the memory element is erased, and defined as logic "1." The threshold voltage after a program operation is positive and defined as logic "0." When the threshold voltage is negative and a read is attempted, the memory element will turn on to indicate logic "1" is being stored. When the threshold voltage is positive and a read operation is attempted, the memory element will not turn on, which indicates that logic "0" is stored. A memory element can also store multiple levels of information, for example, multiple bits of digital data. In this case, the range of threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00." The specific relationship between the data programmed into the memory element and the threshold voltage ranges of the element depends upon the data encoding scheme adopted for the memory elements. For example, U.S. Pat. No. 6,222,762 and U.S. patent application Ser. No. 10/461,244, "Tracking Cells For A Memory System," filed on Jun. 13, 2003, and published as U.S. Patent Application Publication 2004/0255090 on Dec. 16, 2004, both of which are incorporated herein by reference in their entirety, describe various data encoding schemes for multi-state flash memory elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash memory element, a program voltage is applied to the control gate of the element and the bit line associated with the element is grounded. Electrons from the channel are injected into the floating gate. When electrons accumulate in the floating gate, the floating gate becomes negatively charged and the threshold voltage of the element is raised. To apply the program voltage to the control gate of the element being programmed, that program voltage is applied on the appropriate word line. As discussed above, that word line is also connected to one element in each of the other NAND strings that share the same word line. For example, when programming element 224 of FIG. 4, the program voltage will also be applied to the control gates of elements 224, 244 and 264. A problem arises when it is desired to program one element on a word line without programming other elements connected to the same word line, for example, when it is desired to program element 224 but not element 244. Because the program voltage is applied to all elements connected to a word line, an unselected element (an element that is not to be programmed) on the word line, may become inadvertently programmed, in the process referred to as program disturb. For example, when programming element 224, there is a concern that the adjacent element 244 or 264 might unintentionally be programmed. Note that program disturb is most likely to occur on unselected memory cells on a word line selected for programming. However, in some cases, program disturb may also occur on memory cells on other than the selected word line.

Several techniques can be employed to prevent program disturb. With self boosting, discussed previously, the channels associated with the unselected bit lines are electrically isolated and a pass voltage (e.g., 10 V) is applied to the unselected word lines during programming. The unselected word lines couple to the channels associated with the unselected bit lines, causing a voltage (e.g., 8 V) to exist in the channel of the unselected bit lines, which tends to reduce program disturb. Thus, self boosting causes a voltage boost to exist in the channel which tends to lower the voltage across the tunnel oxide and hence reduce program disturb.

A NAND string is typically (but not always) programmed from the source side to the drain side, for example, from memory element 228 to memory element 222. For example, assume the NAND string 203 is programmed before the NAND string 201. When the programming process is ready to program the last (or near the last) memory element of the NAND string 201, if all or most of the previously programmed memory elements on the NAND string being inhibited (e.g., NAND string 203) were programmed, then there is negative charge in the floating gates of the previously programmed memory elements. As a result, the boosting potential does not get high enough in portions of the NAND string 203 and there still may be program disturb on the elements in the NAND string 203 associated with the last few word lines. For example, when programming element 222 on NAND string 201, if elements 248, 246 and 244 on NAND string 203 were previously programmed, then each of those transistors (244, 246, 248) have a negative charge on their floating gate which will limit the boosting level of the self boosting process and possibly cause program disturb on element 242.

Local Self Boosting (LSB) and Erased Area Self Boosting (EASB) attempt to address the shortcomings of conventional self boosting by isolating the channel of previously programmed elements from the channel of the element being inhibited. For example, if element 224 of FIG. 4 is being programmed, LSB and EASB attempt to inhibit programming in element 244 by isolating the channel of element 244 from the previously programmed elements (246 and 248). For the SB, EASB, and LSB boosting methods or variations of these boosting methods, the bit line for the element being programmed is at ground or connected to another voltage close to 0 V, typically in a 0-1 V range, while the bit line of the NAND string with the element being inhibited is at $V_{dd}$, typically in a range of 1.5-3 V. The program voltage $V_{pgm}$ (e.g., 20 V) is connected to the selected word line. In case of the LSB boosting mode, the word lines neighboring the selected word line are at 0 V, or at another voltage close to 0 V, while the remaining non-selected word lines are at $V_{pass}$. For example, bit line 202 is at 0 V and bit line 204 is at $V_{dd}$. Drain select SCG is at $V_{sgd}$ (typically 2.5-4.5 V) and source select SGS is at 0 V. Selected word line WL2 (for programming element 224) is at $V_{pgm}$. Neighboring word lines WL1 and WL3 are at 0 V, and other word lines (e.g., WL0) are at $V_{pass}$.

A disadvantage of the LSB mode is that the boosted channel voltage under the selected word line can be very high, as that part of the channel is isolated from the other channel areas under the unselected word lines and, thus, the boosting voltage is mainly determined by the high programming voltage, $V_{pgm}$. Due to the high boosting, band-to-band tunneling or GIDL near the word lines that are biased to 0 V can occur. The amount of channel boosting can be limited to a lower value by using the EASB method. EASB is similar to LSB with the exception that only the source side neighbor word line is at 0 V. Thus, the channel area under the selected word line and the channel area at the drain side of the selected cells are connected and, thus, the channel boosting is determined mainly by the $V_{pass}$ voltage that is applied to the unselected word lines instead of by $V_{pgm}$ as for the LSB case. The drain side neighbor word line is at $V_{pass}$. If $V_{pass}$ is too low, boosting in the channel will be insufficient to prevent program disturb. If $V_{pass}$ is too high, unselected word lines in a selected NAND string (with 0 V on the bit line) may be programmed, or program disturb due to GIDL may occur. For example, WL1 would be at 0 V instead of $V_{pass}$, while WL3 would be at $V_{pass}$. In one embodiment, $V_{pass}$ is 7-10 V.

While LSB and EASB provide an improvement over self boosting, they also present a problem that depends on whether the source side neighbor element (element 246 is the source side neighbor of element 244) is programmed or erased. If the source side neighbor element is in a programmed state, then there is a negative charge on its floating gate. Moreover, with 0 V applied to the control gate, and in combination with the highly reverse biased junction (due to boosting) under the negatively charged gate, this can cause Gate Induced Drain Leakage (GIDL), in which electrons leak into the boosted channel. GIDL occurs with a large bias over the junction, which is caused by a high voltage on the drain/source region of the memory cells due to boosting, and a low or negative gate voltage, which is precisely the case when the source side neighbor element is programmed and the drain junction is boosted. GIDL can cause the boosted voltage to leak away prematurely, resulting in a programming error, and is more severe with the abruptly and highly doped junctions, which are required as element dimensions are scaled. If the leakage current is high enough, the boosting potential in the channel region will decrease possibly resulting in program disturb. Furthermore, the closer the word line being programmed is to the drain, the less charge is present in the boosted channel area. Thus, the voltage in the boosted channel will drop quickly, causing program disturb. Another possible side-effect of GIDL is that hot carriers, both electrons and holes, can be generated. These hot carriers may be injected into the tunnel oxide areas or into the floating gates of neighboring memory cells and thus causing program disturb.

If the source side neighbor memory element is erased, then there is positive charge on the floating gate and the threshold voltage of the transistor will likely be negative. The transistor may not turn off even when 0 V is applied to the word line. If the memory element is on, then the NAND string is not operating in EASB mode. Rather, that NAND string is operating in self boosting mode, which has the possible problems with insufficient boosting as discussed above. This scenario is most likely if other source side elements are programmed, which limits source side boosting. This issue is most problematic with shorter channel lengths, as leakage is more likely to occur.

Figure 5:
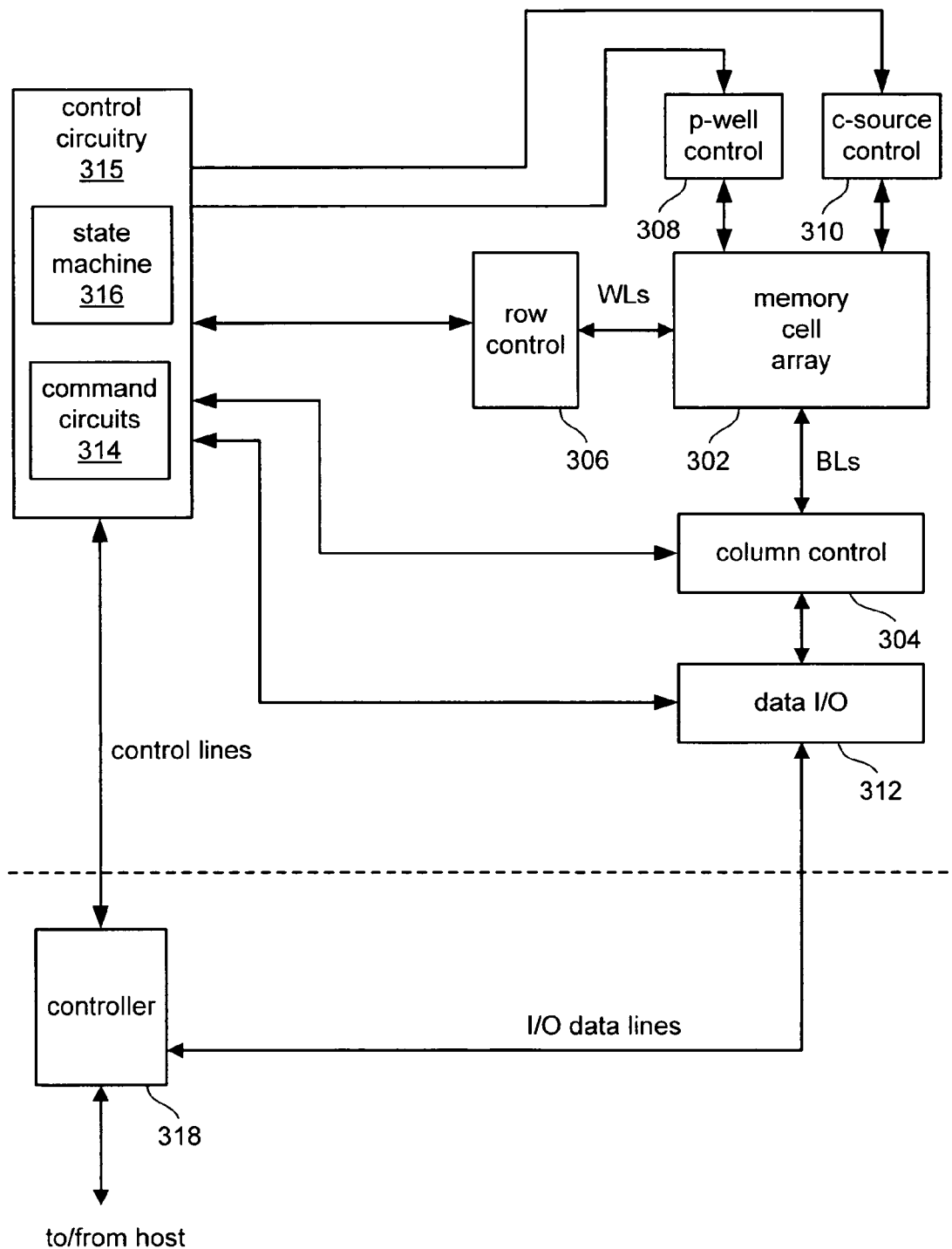
FIG. 5 is a block diagram of one embodiment of a flash memory system that can be used to implement one or more embodiments of the present disclosure.

FIG. 5 is a block diagram of one embodiment of a flash memory system that can be used to implement one or more embodiments of the present disclosure. Other systems and implementations can be used. Memory element array 302 is controlled by column control circuit 304, row control circuit 306, c-source control circuit 310 and p-well control circuit 308. Column control circuit 304 is connected to the bit lines of memory element array 302 for reading data stored in the memory elements, for determining a state of the memory elements during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory elements. P-well control circuit 308 controls the p-well voltage.

The data stored in the memory elements is read out by the column control circuit 304 and output to external I/O lines via data input/output buffer 312. Program data to be stored in the memory elements are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, digital camera, personal digital assistant of the like. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory element array 302.

One exemplary memory system comprises one integrated circuit that includes controller 318, and one or more integrated circuit chips that each contains a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g., including the controller) or just the memory array(s) with associated peripheral circuits (with the controller or control function being embedded in the host). Thus, the controller can be embedded in the host or included within the removable memory system.

In some implementations, some of the components of FIG. 5 can be combined. Further, in various designs, one or more of the components of FIG. 5, other than the memory element array 302, can be thought of as a managing circuit. For example, one or more managing circuits may include any one of, or a combination of, control circuitry, a command circuit, a state machine, a row control circuit, a column control circuit, a well control circuit, a source control circuit and a data I/O circuit.

Figure 6:
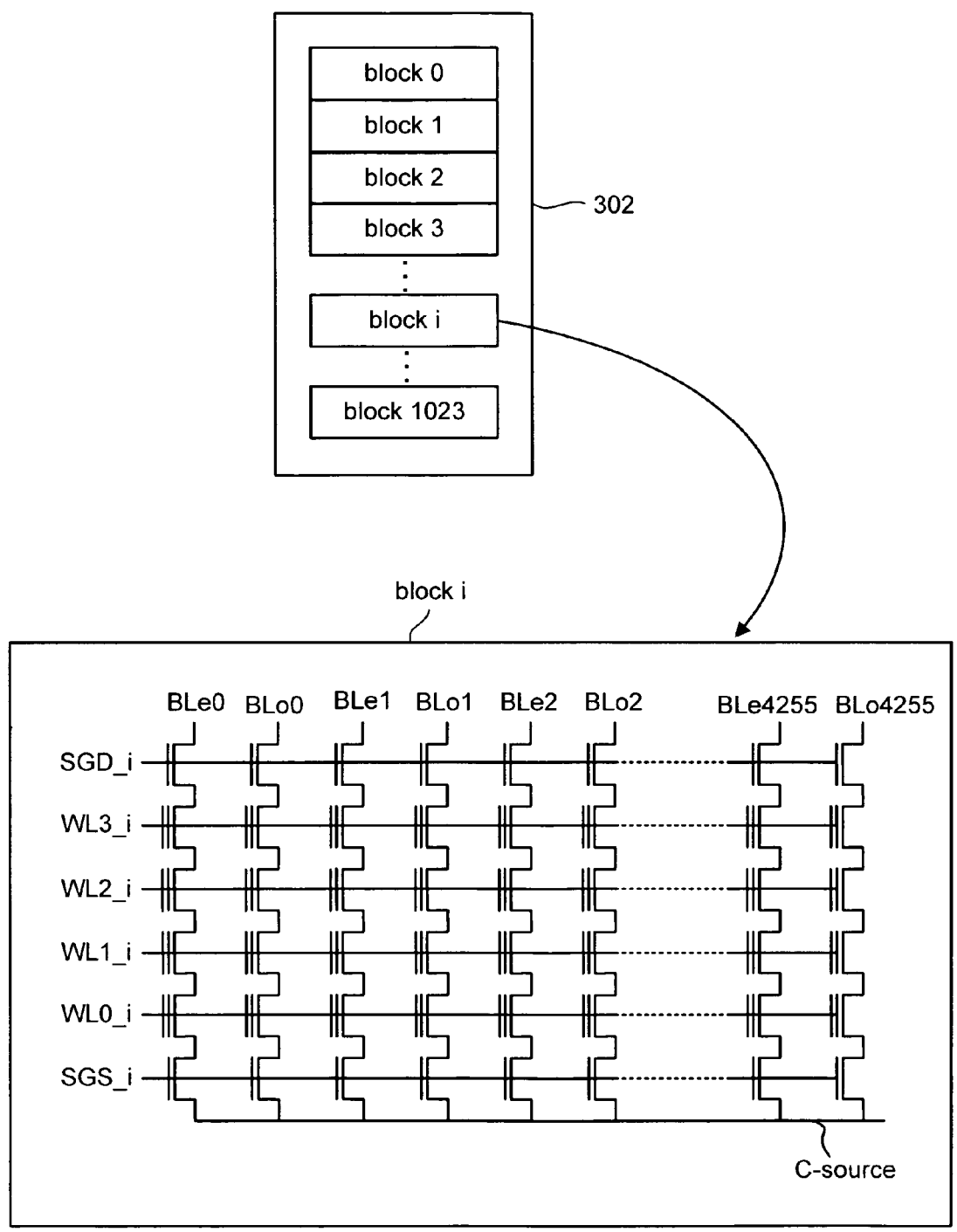
FIG. 6 illustrates an example of an organization of a memory array.

FIG. 6 provides an example structure of the memory element array 302 of FIG. 5. As one example, a NAND flash EEPROM is described that is partitioned into 1,024 blocks. In an erase operation, the data stored in each block is simultaneously erased. In one design, the block is the minimum unit of elements that are simultaneously erased. In each block, in this example, there are 8,512 columns that are divided into even columns and odd columns. The bit lines are also divided into even bit lines (BLe) and odd bit lines (BLo). Four memory elements are shown connected in series to form a NAND string. Although four elements are shown to be included in each NAND string, more or fewer than four memory elements can be used. One terminal of the NAND string is connected to a corresponding bit line via a select transistor SGD, and another terminal is connected to the c-source line via a second select transistor SGS.

During one configuration of read and programming operations, 4,256 memory elements are simultaneously selected. The memory elements selected have the same word line and the same kind of bit line (e.g., even bit lines or odd bit lines). Therefore, 532 bytes of data, which form a logical page, can be read or programmed simultaneously, and one block of the memory can store at least eight logical pages (four word lines, each with odd and even pages). For multi-state memory elements, when each memory element stores two bits of data, where each of these two bits are stored in a different page, one block stores sixteen logical pages. Other sized blocks and pages can also be used with the present invention. Additionally, architectures other than those of FIGS. 5 and 6 can also be used to implement the present invention. For example, in one design, the bit lines are not divided into odd and even bit lines so that all bit lines can be programmed and read concurrently (or not concurrently).

Memory elements can be erased by raising the p-well to an erase voltage (e.g., 20 V) and grounding the word lines of a selected block. The source and bit lines are floating. Erasing can be performed on the entire memory array, separate blocks, or another unit of the memory elements which is a portion of the memory device. Electrons are transferred from the floating gates of the memory cells to the p-well region so that the threshold voltage of the memory cells becomes negative.

In the read and verify operations, the select gates (SGD and SGS) are connected to a voltage in a range of 2.5 to 4.5 V and the unselected word lines (e.g., WL0, WL2 and WL3, when WL1 is the selected word line) are raised to a read pass voltage (typically a voltage in the range of 4.5 to 6 V) to make the transistors operate as pass gates. The selected word line WL1 is connected to a voltage, a level of which is specified for each read and verify operation in order to determine whether a threshold voltage of the concerned memory element is above or below such level. For example, in a read operation for a two-level memory element, the selected word line WL1 may be grounded, so that it is detected whether the threshold voltage is higher than 0 V. In a verify operation for a two level memory element, the selected word line WL1 is connected to 0.8 V, for example, so that it is verified whether or not the threshold voltage has reached at least 0.8 V. The source and p-well are at 0 V. The selected bit lines, assumed to be the even bit lines (BLe), are pre-charged to a level of, for example, 0.7 V. If the threshold voltage is higher than the read or verify level on the word line, the potential level of the bit line (BLe) associated with the element of interest maintains the high level because of the non-conductive memory element. On the other hand, if the threshold voltage is lower than the read or verify level, the potential level of the concerned bit line (BLe) decreases to a low level, for example, less than 0.5 V, because the conductive memory element discharges the bitline. The state of the memory element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of elements that are written at one time as a basic programming operation. One or more pages of data are typically stored in one row of memory elements. A page can store one or more sectors. A sector includes user data and overhead data, such as an Error Correction Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16-20 bytes. A large number of pages form a block that includes anywhere from 8 pages, for example, up to 32, 64 or more pages.

Figure 7:
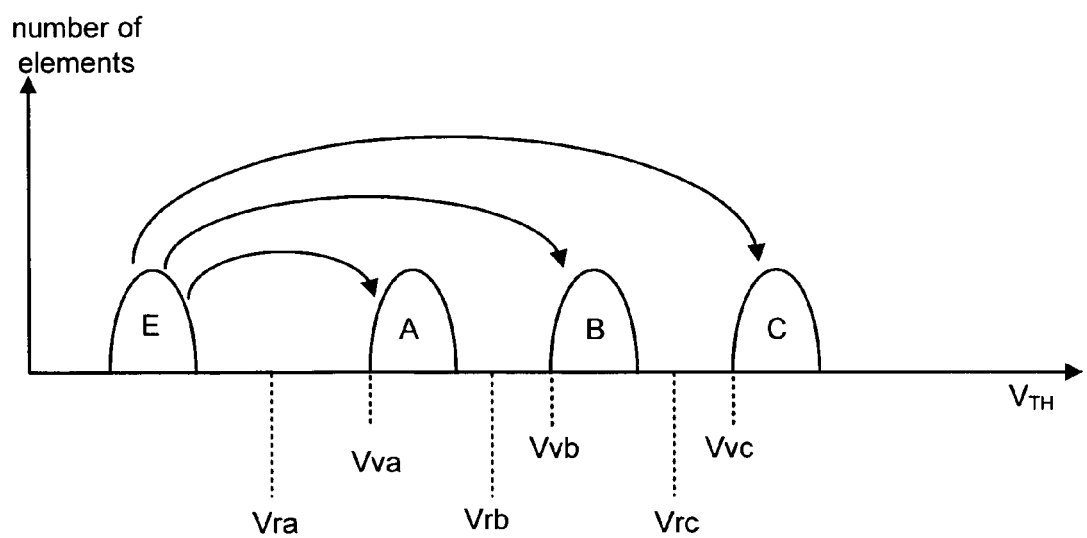
FIG. 7 depicts an example set of threshold voltage distributions in a multi-state device with direct programming from the erased state to a programmed state.

FIG. 7 illustrates threshold voltage distributions for the memory element array when each memory element stores two bits of data. E depicts a first threshold voltage distribution for erased memory elements. A, B and C depict three threshold voltage distributions for programmed memory elements. In one design, the threshold voltages in the E distribution are negative and the threshold voltages in the A, B and C distributions are positive.

Each distinct threshold voltage range corresponds to predetermined values for the set of data bits. The specific relationship between the data programmed into the memory element and the threshold voltage levels of the element depends upon the data encoding scheme adopted for the elements. One example assigns "11" to the threshold voltage range E (state E), "10" to the threshold voltage range A (state A), "00" to the threshold voltage range B (state B) and "01" to the threshold voltage range C (state C). However, in other designs, other schemes are used.

Three read reference voltages, Vra, Vrb and Vrc, are used for reading data from memory elements. By testing whether the threshold voltage of a given memory element is above or below Vra, Vrb and Vrc, the system can determine the state of the memory element. Three verify reference voltages, Vva, Vvb and Vvc are also indicated. When programming memory elements to state A, B or C, the system will test whether those memory elements have a threshold voltage greater than or equal to Vva, Vvb or Vvc, respectively.

In one approach, known as full sequence programming, memory elements can be programmed from the erase state E directly to any of the programmed states A, B or C (as depicted by the curved arrows). For example, a population of memory elements to be programmed may first be erased so that all memory elements in the population are in the erased state E. While some memory elements are being programmed from state E to state A, other memory elements are being programmed from state E to state B and/or from state E to state C.

Figure 8:
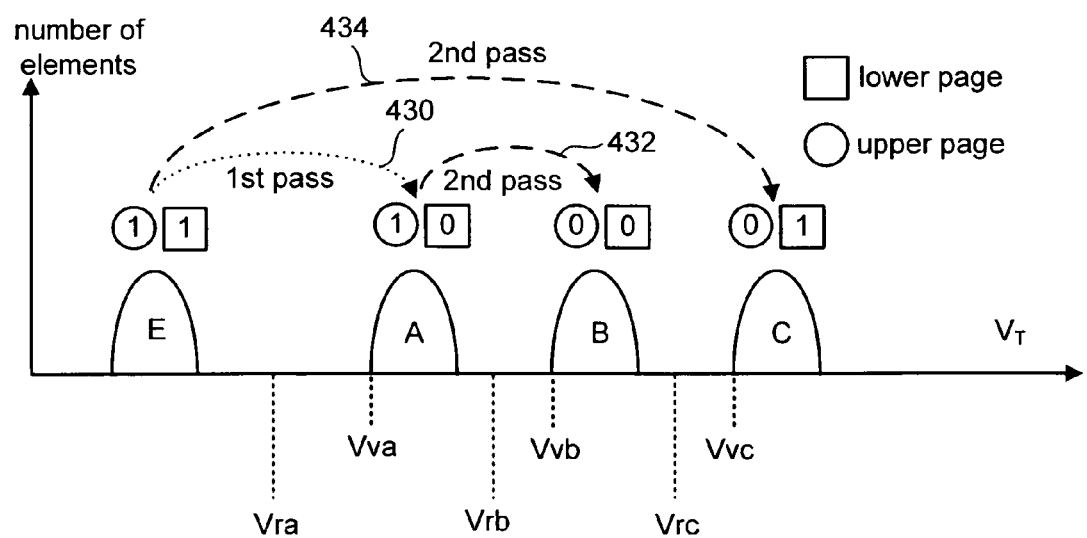
FIG. 8 depicts an example set of threshold voltage distributions in a multi-state device with two-pass programming from the erased state to a programmed state.

FIG. 8 illustrates an example of a two-pass technique of programming a multi-state memory element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the element's threshold voltage level is set according to the bit to be programmed into the lower logical page. If that bit is a logic "1," the threshold voltage is not changed since it is in the appropriate state as a result of having been previously erased. However, if the bit to be programmed is a logic "0," the threshold level of the element is increased to be state A, as shown by arrow 430. That concludes the first programming pass.

In a second programming pass, the element's threshold voltage level is set according to the bit being programmed into the upper logical page. If the upper logical page bit is to store a logic "1," then no programming occurs since the element is in one of the states E or A, depending upon the programming of the lower page bit, both of which carry an upper page bit of "1." If the upper page bit is to be a logic "0," then the threshold voltage is shifted. If the first pass resulted in the element remaining in the erased state E, then, in the second phase, the element is programmed so that the threshold voltage is increased to be within state C, as depicted by arrow 434. If the element had been programmed into state A as a result of the first programming pass, then the memory element is further programmed in the second pass so that the threshold voltage is increased to be within state B, as depicted by arrow 432. The result of the second pass is to program the element into the state designated to store a logic "0" for the upper page without changing the data for the lower page.

In one approach, a system can be set up to perform full sequence writing if enough data is written to fill up an entire page. If not enough data is written for a full page, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's memory elements. More details of such an approach are disclosed in U.S. patent application Ser. No. 11/013,125, titled "Pipelined Programming of Non-Volatile Memories Using Early Data," filed on Dec. 14, 2004 by inventors Sergy A. Gorobets and Yan Li, and incorporated herein by reference in its entirety.

Figure 9A:
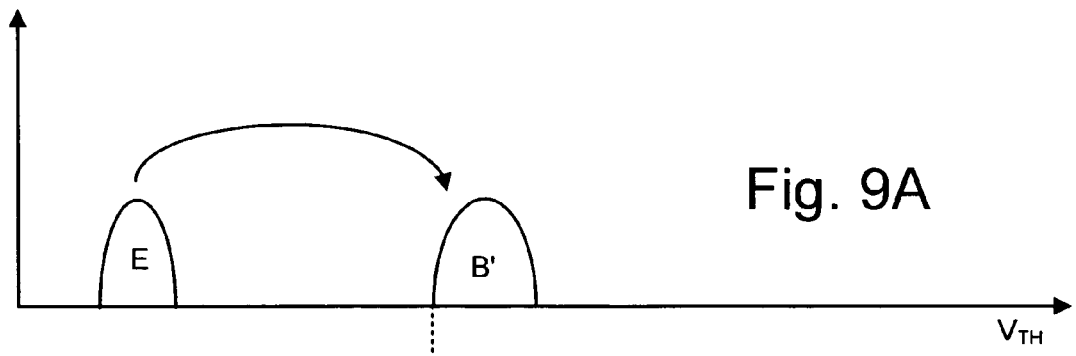
FIGS. 9A-C show various threshold voltage distributions and describe a process for programming non-volatile memory.
Figure 9B:
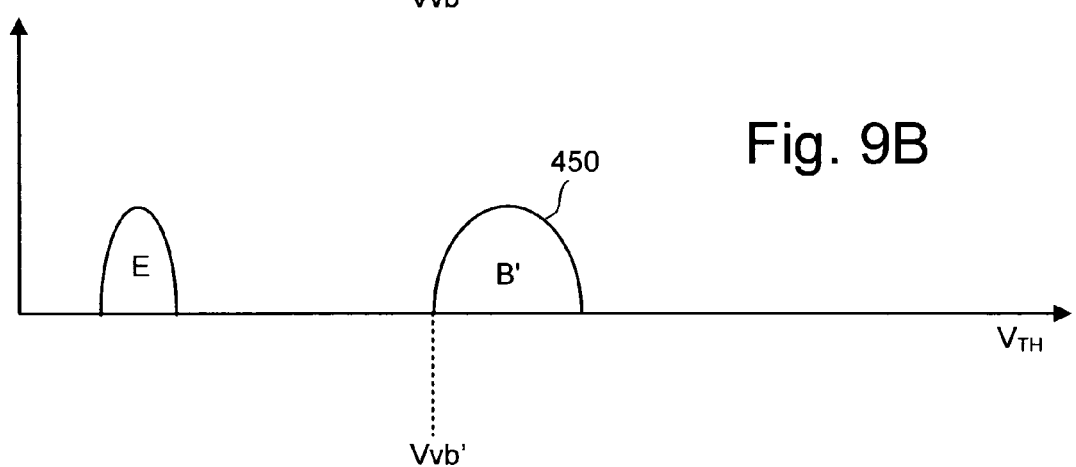
Figure 9C:
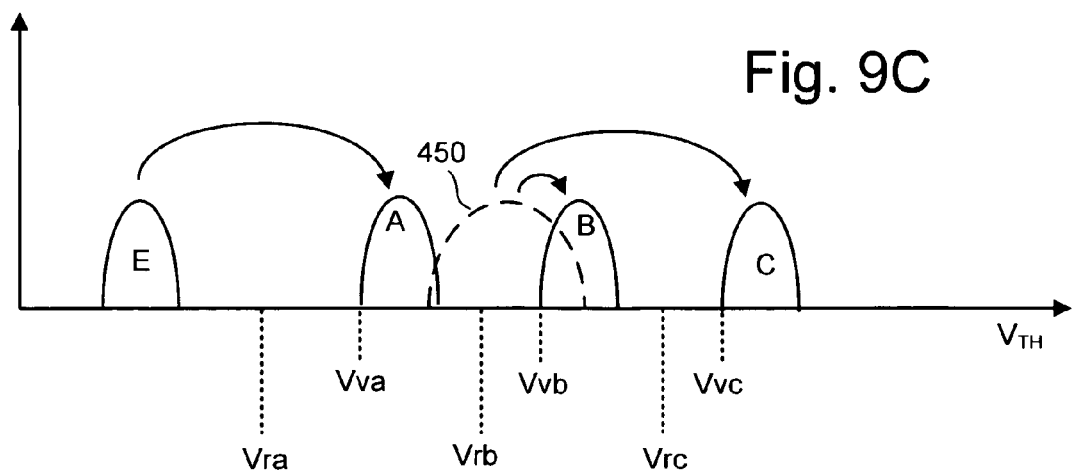

FIGS. 9A-C depict another process for programming non-volatile memory that reduces floating gate-to-floating gate coupling by, for any particular memory element, writing to that particular memory element with respect to a particular page subsequent to writing to adjacent memory elements for previous pages. In one example implementation, each of the non-volatile memory elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps. In the first step, the lower page is programmed. If the lower page is to remain data 1, then the memory element state remains at state E. If the data is to be programmed to 0, then the voltage threshold $V_{TH}$ of the memory element is raised such that the memory element is programmed to state B'. FIG. 9A therefore shows the programming of memory elements from state E to state B', which represents an interim state B; therefore, the verify point is depicted as Vvb', which is lower than Vvb, depicted in FIG. 9C.

In one design, after a memory element is programmed from state E to state B', its neighbor memory element on an adjacent word line is programmed with respect to its lower page. After programming the neighbor memory element, the floating gate-to-floating gate coupling effect will raise the apparent threshold voltage of memory element under consideration, which is in state B'. This will have the effect of widening the threshold voltage distribution for state B' to that depicted as threshold voltage distribution 450 in FIG. 9B. This apparent widening of the threshold voltage distribution will be remedied when programming the upper page.

FIG. 9C depicts the process of programming the upper page. If the memory element is in erased state E and the upper page is to remain at 1, then the memory element will remain in state E. If the memory element is in state E and its upper page data is to be programmed to 0, the threshold voltage of the memory element will be raised so that the memory element is in state A. If the memory element is in state B' with the intermediate threshold voltage distribution 450 and the upper page data is to remain at 1, the memory element will be programmed to final state B. If the memory element is in state B' with the intermediate threshold voltage distribution 450 and the upper page data is to become data 0, the threshold voltage of the memory element will be raised so that the memory element is in state C. The process depicted by FIGS. 9A-C reduces the effect of floating gate-to-floating gate coupling because only the upper page programming of neighbor memory elements will have an effect on the apparent threshold voltage of a given memory element. An example of an alternate state coding is to move from distribution 450 to state C when the upper page data is a 1, and to move to state B when the upper page data is a 0. Although FIGS. 9A-C provide an example with respect to four data states and two pages of data, the concepts taught can be applied to other implementations with more or fewer than four states and more or fewer than two pages. More detail about various programming schemes and floating gate-to-floating gate coupling can be found in U.S. patent application Ser. No. 11/099,133, titled "Compensating For Coupling During Read Operations Of Non-Volatile Memory," filed on Apr. 5, 2005.

Adjusting Pass Voltages to Reduce Program Disturb

In memory devices such as NAND flash memory devices, various programming methods can be used. For example, self boosting (SB) can be used for binary devices since it allows word lines in one NAND string to be programmed in a random order. For multi-level cell (MLC) devices, however, random order programming is typically not used. In this case, LSB and EASB or variations of these methods can be used. An advantage of LSB and EASB based methods is that channel boosting is more efficient and, therefore, program disturb can be reduced. However, as memory cell dimensions scale downward, EASB becomes less efficient because the channel length of the memory cells is too short to sufficiently isolate the two separately boosted channel areas at the drain and source sides of the selected word line. As a result, the boosted channel voltage is lowered and program disturb worsens. Another problem associated with EASB is that band-to-band tunneling or GIDL related breakdown can occur near the drain of the grounded word line. Due to this breakdown, the boosted channel can be discharged, causing program disturb, or hot carriers may be generated that are injected in the tunnel oxides or the floating gates of the memory cells. The problem is illustrated with reference to FIG. 10.

Figure 10:
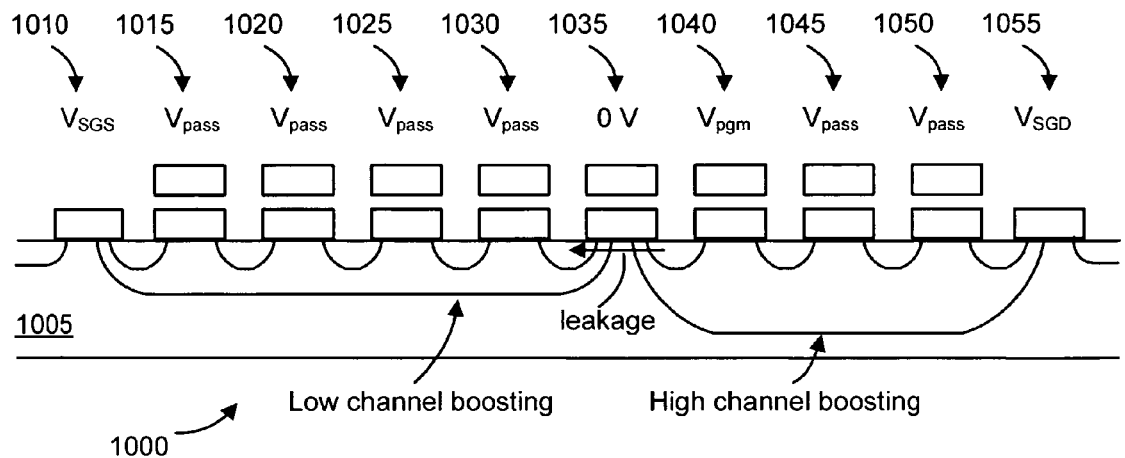
FIG. 10 illustrates a NAND string with unbalanced boosted channel regions when the EASB boosting mode is used.

FIG. 10 illustrates a NAND string with unbalanced boosted channel regions when the EASB boosting mode is used. The NAND string, shown generally at 1000, includes a source side select gate 1010, drain side select gate 1055, and respective memory elements 1015, 1020, 1025, 1030, 1035, 1040, 1045 and 1050 arranged therebetween in a p-well region 1005. Thus, in the present example, there are eight memory elements; however, other configurations may be used. As mentioned, in one possible approach, programming may begin at the source side memory element, e.g., element 1015, and progress one element at a time to the drain side element 1050. Memory element 1040, which is the selected element that is currently being programmed in the present example, receives the programming voltage, $V_{pgm}$, via its respective word line. A pass voltage, $V_{pass}$, typically in the range of 5-10 V, is applied to the remaining memory elements via their respective word lines, except for element 1035 which receives 0 V or another voltage close to 0 V, typically in the 0-1 V range. When memory element 1040 is being programmed, memory elements 1015, 1020, 1025, 1030 and 1035 have already been programmed, in one programming approach, and memory elements 1045 and 1050 have not yet been programmed or at least have not yet reached their final programmed state. That is, the memory elements 1045 and 1050 are unprogrammed and/or partly programmed. In some cases, as with the programming scheme depicted in FIG. 9, the memory element 1045 maybe in the intermediate programmed state B'. Furthermore, element 1135 may also be in an intermediate programmed state in case of the programming scheme of FIG. 9. In another possible programming approach, the memory element 1035 next to the selected memory element 1040 has only been partly programmed when the memory element 1040 is being programmed.

Furthermore, a bitline contact associated with the NAND string 1000 can be grounded, or coupled to a partial inhibit voltage (typically in the range of 0.2 to 1 V) for fine mode programming, while the elements are being programmed. After element 1040 on the selected word line in the NAND string 1000 has been programmed to the desired state, an inhibit voltage $V_{dd}$ can be applied to the bitline contact to inhibit element 1040 from further programming until other elements located on other NAND strings connected to the same selected word line have been programmed to the desired state as well.

Due to the application of the pass voltages, a low channel boosting region is formed under the previously programmed memory elements, e.g., on the source side of the selected word line of NAND string 1000, while a high channel boosting region is formed under the selected element and the unprogrammed and/or partly programmed memory elements, e.g., on the drain side of the selected word line of NAND string 1000. These boosted regions are illustrated diagrammatically in FIG. 10. Generally, memory elements that have been programmed to a certain state cause the boosting of an associated channel region under those memory elements to be less effective. Moreover, as additional elements are programmed, the poorly boosted region will increase in size while the size of the highly boosted region of unprogrammed and/or partly programmed elements decreases. Due to the difference in the boosted channel potentials, charge may leak from the highly boosted channel region to the lowly boosted channel region, causing the potential in the highly boosted region to decrease. As a result, program disturb for the unselected memory elements located on the selected word line will increase. This leakage of charge from the highly boosted region to the lowly boosted region can be prevented by increasing the boosted channel potential in the already programmed region. This can be achieved, in one approach, by using a higher $V_{pass}$ value for the word lines associated with the memory elements that have already been programmed, as illustrated in connection with FIG. 11.

Figure 11:
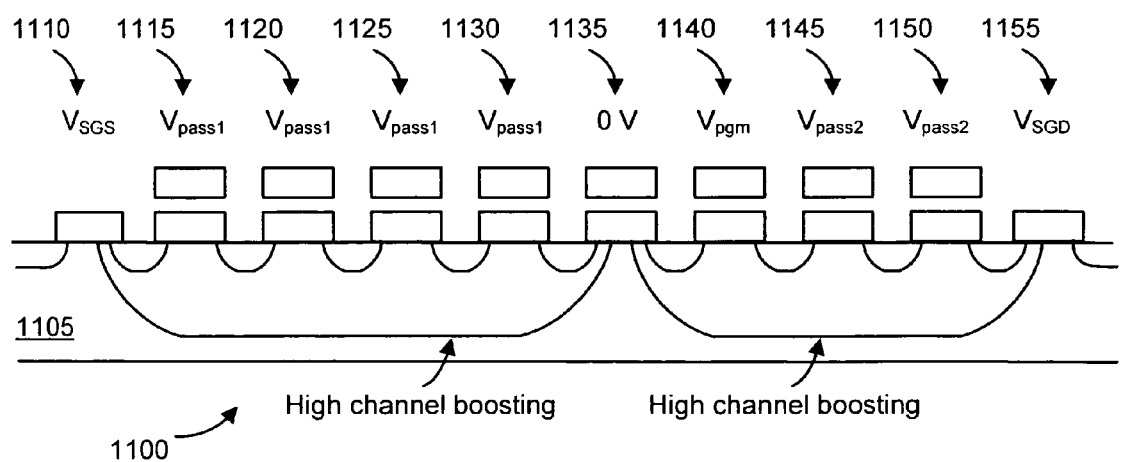
FIG. 11 illustrates a NAND string with balanced boosted channel regions.

FIG. 11 illustrates a NAND string with balanced boosted channel regions. The NAND string, shown generally at 1100, includes a source side select gate 1110, drain side select gate 1155, and respective memory elements 1115, 1120, 1125, 1130, 1135, 1140, 1145 and 1150 arranged therebetween in a p-well region 1105. In one possible approach, programming begins at the source side memory element, e.g., element 1115, and progresses one element at a time to the drain side element 1150. Memory element 1140, which is the selected element that is currently being programmed in the present example, receives $V_{pgm}$, via its respective word line. Moreover, in this case, $V_{pass1} > V_{pass2}$. In particular, the higher pass voltage, $V_{pass1}$, is applied to the previously programmed memory elements, e.g., elements 1115, 1120, 1125 and 1130 via their respective word lines, with the exception of the source side element 1135, which receives 0 V. The lower pass voltage, $V_{pass2}$, is applied to the unprogrammed elements or to elements that have not yet reached their final programmed state, at the drain side of the selected element, e.g., elements 1145 and 1150, via their respective word lines. Thus, in this example and the following examples, $V_{pass1}$ and $V_{pass2}$ are applied to respective subsets of the memory elements in the NAND string, where each subset includes one or more memory elements on opposing sides of the memory element that is currently being programmed, but not necessarily all of the memory elements on the opposing sides of the memory element that is currently being programmed. As mentioned before, the element next to the selected element, element 1145 in this example, may be in an intermediate programmed state B' in case the programming scheme of FIG. 9 is used. Furthermore, element 1135 may also be in an intermediate programmed state in case of the programming scheme of FIG. 9.

In practice, approximately 0-1 V may be applied to the source side element 1135. Since the leakage is reduced by a more equal boosting on the drain and source side, the boosted potential may still be high enough, even with the possible increased leakage by the higher biased word line next to the selected word line. A bias higher than 0 V on the word line next to the selected word line will reduce the possibility that band-to-band tunneling can occur on that word line.

Thus, boosting is improved for the channel region that corresponds with the memory elements that already have been programmed. In particular, high channel boosted regions are formed under the previously programmed memory elements, as well as under the selected element and the unprogrammed and/or partly programmed memory elements. The increased $V_{pass}$ for the channel region associated with the previously programmed memory elements compensates for the effect of lower boosting due to the elements being in the programmed state. An exact compensation requires knowledge of which states the programmed elements are in. However, the number of programmed elements and the states to which they are programmed will be different for each NAND string. Compensation in the range of approximately 2-3 V, with a higher $V_{pass}$ on the word lines associated with the previously programmed elements, is expected to optimally compensate for the average case when random data is written in the previously programmed elements. That is, $V_{pass1}$ may exceed $V_{pass2}$ by approximately 2-3 V. This differential can be optimized for specific memory devices by testing.

Note that the application of the above mentioned method is not limited to EASB, but can also be applied to the conventional SB method and to LSB, as well as to variations of these methods. Generally, compensation is provided for the reduced boosting of the channel on the source side of the selected memory element, which is caused by some or all of the memory elements being in a programmed state, by increasing $V_{pass}$ for the word lines associated with the already programmed memory elements so that charge leakage between the two boosted regions is reduced or eliminated. As a result, the boosted channel potential under the selected word line and the word lines associated with the unprogrammed and/or partly programmed memory elements will be higher and almost independent of which word line is being programmed, therefore, program disturb will be reduced and show less word line dependence. Moreover, due to the improved boosting, $V_{pass2}$ may be lower than that used conventionally. For example, in one possible approach, $V_{pass1}$ is approximately 10-11 V while $V_{pass2}$ is approximately 8 V, and $V_{pgm}$ can range from, e.g., 16-24 V in successive pulses of increasing magnitude. Optimal levels for $V_{pass1}$ and $V_{pass2}$ for specific memory devices can be determined by testing. It is also expected that band-to-band tunneling will be reduced since the lateral electric field under the grounded word line will be reduced by this boosting technique. A further reduction of band-to-band tunneling may be accomplished by a boosting scheme as discussed in connection with FIG. 12.

Figure 12:
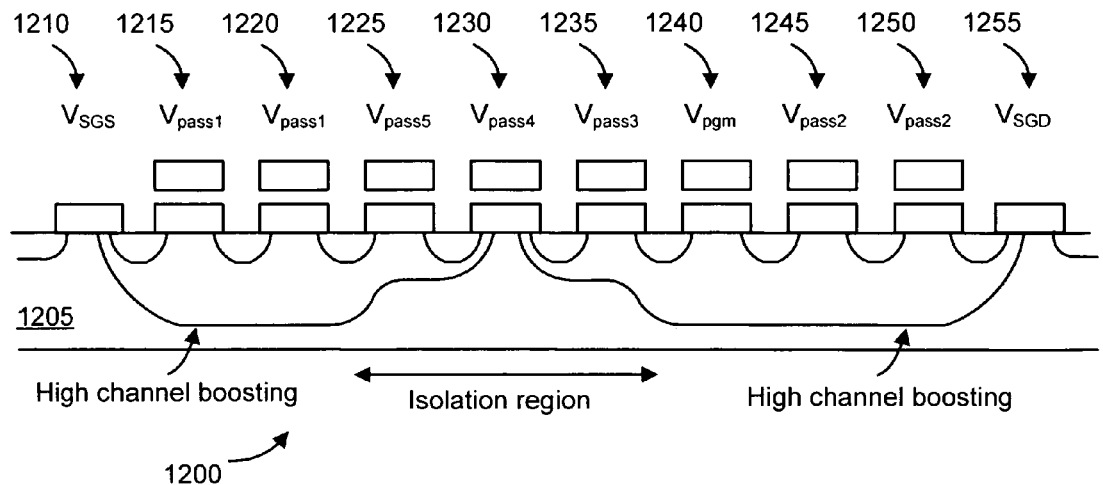
FIG. 12 illustrates a NAND string with an isolation region between boosted channel regions.

FIG. 12 illustrates a NAND string with an isolation region between boosted channel regions. The NAND string, shown generally at 1200, includes a source side select gate 1210, drain side select gate 1255, and respective memory elements 1215, 1220, 1225, 1230, 1235, 1240, 1245 and 1250 arranged therebetween in a p-well region 1205. Memory element 1240, which is the selected element that is currently being programmed in the present example, receives $V_{pgm}$ via its respective word line. A higher pass voltage, $V_{pass1}$, is applied to one or more of the previously programmed memory elements, e.g., elements 1215 and 1220, via their respective word lines, while a lower pass voltage, $V_{pass2}$, is applied to the unprogrammed and/or partly programmed elements, e.g., elements 1245 and 1250, via their respective word lines. Additionally, reduced pass voltages $V_{pass3}$, $V_{pass4}$ and $V_{pass5}$ are applied to previously programmed elements 1235, 1230 and 1225, respectively, which are between the selected element 1240 and the elements 1215 and 1220 which receive the pass voltage $V_{pass1}$. $V_{pass3}$, $V_{pass4}$ and $V_{pass5}$ are less than $V_{pass1}$.

In one approach, $V_{pass4}$ is less than $V_{pass3}$ and $V_{pass5}$. $V_{pass3}$ and $V_{pass5}$ may be approximately equal to one another. Alternatively, $V_{pass3}$ and $V_{pass5}$ differ. For example, $V_{pass3}$ and $V_{pass5}$ may be approximately 2-4 V, while $V_{pass4}$ is approximately 0-1 V. As before, $V_{pass1}$ may be approximately 10-11 V while $V_{pass2}$ may be approximately 8 V, and $V_{pgm}$ can range from, e.g., 16-24 V in successive pulses. Optimal voltages may be determined for specific memory devices by testing. In this approach, the applied voltages essentially form a trough or isolation region which is centered about the memory element with the lowest applied pass voltage, e.g., element 1230, where the pass voltages increase symmetrically asymmetrically or on each side of the isolation region. The isolation region can include an odd or even number of memory elements. The isolation region serves to isolate the two highly boosted channel regions and to reduce the voltage on the drain and source area of the word line with the lowest bias voltage, e.g., the word line associated with element 1230, to avoid or reduce band-to-band tunneling under that word line. A further embodiment with an alternative isolation region is provided in connection with FIG. 13.

Figure 13:
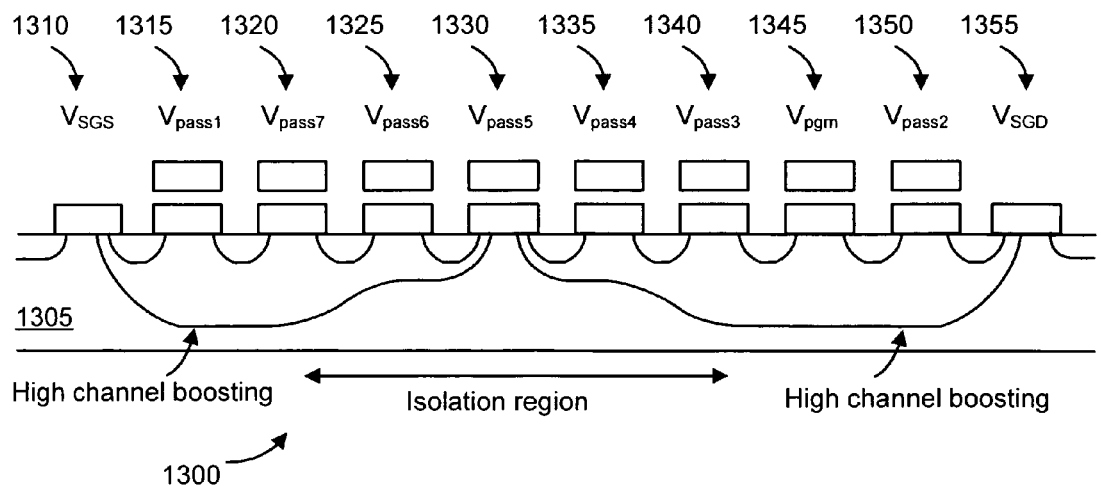
FIG. 13 illustrates a NAND string with an alternative isolation region between boosted channel regions.

FIG. 13 illustrates a NAND string with an alternative isolation region between boosted channel regions. The NAND string, shown generally at 1300, includes a source side select gate 1310, drain side select gate 1355, and respective memory elements 1315, 1320, 1325, 1330, 1335, 1340, 1345 and 1350 arranged therebetween in a p-well region 1305. Memory element 1345, which is the selected element that is currently being programmed in the present example, receives $V_{pgm}$ via its respective word line. A higher pass voltage, $V_{pass1}$, is applied to one or more of the previously programmed memory elements, e.g., element 1315, via its respective word line, while a lower pass voltage, $V_{pass2}$, is applied to one or more unprogrammed and/or partly programmed elements, e.g., element 1350, via its respective word line. Additionally, reduced pass voltages $V_{pass3}$, $V_{pass4}$, $V_{pass5}$, $V_{pass6}$ and $V_{pass7}$ are applied to previously programmed elements 1340, 1335, 1330, 1325 and 1320, respectively, which are between the selected element 1345 and the element 1315 which receives the pass voltage $V_{pass1}$.

In one approach, $V_{pass5}$ is less than $V_{pass3}$, $V_{pass4}$, $V_{pass6}$ and $V_{pass7}$. Additionally, $V_{pass4}$ and $V_{pass6}$ may be less than $V_{pass3}$ and $V_{pass7}$. $V_{pass3}$, $V_{pass4}$, $V_{pass5}$, $V_{pass6}$ and $V_{pass7}$ are less than $V_{pass1}$. $V_{pass4}$ and $V_{pass6}$ may be approximately equal to one another. Alternatively, $V_{pass4}$ and $V_{pass6}$ differ. Similarly, $V_{pass3}$ and $V_{pass7}$ may be approximately equal to one another. Alternatively, $V_{pass3}$ and $V_{pass7}$ differ. For example, $V_{pass3}$ and $V_{pass7}$ may be approximately 6-8 V, $V_{pass4}$ and $V_{pass6}$ may be approximately 2-4 V and $V_{pass5}$ may be approximately 0-1 V. As before, $V_{pass1}$ may be approximately 10-11 while $V_{pass2}$ may be approximately 8 V, and $V_{pgm}$ can range from, e.g., 16-24 V in successive pulses. Optimal voltages may be determined for specific memory devices by testing. In this approach, the applied voltages form an extended trough or isolation region which is centered about the memory element with the lowest applied pass voltage, e.g., element 1330, and the pass voltages increase symmetrically or asymmetrically on each side of the isolation region. Moreover, the isolation region can include an odd or even number of memory elements. The isolation region serves to isolate the two highly boosted channel regions and to reduce the voltage on the drain and source areas of the word line with the lowest bias voltage, e.g., the word line associated with element 1330, to avoid or reduce band-to-band tunneling under that word line. By extending the length of the isolation region, the two highly boosted channel regions are further isolated to avoid or reduce leakage between the two boosted regions and to avoid or reduce band-to-band tunneling under that word line.

The above-mentioned program disturb reduction techniques are suitable for both multi-level cell (MLC) and single-level cell (SLC) or binary programming. An increased benefit is expected for MLC memories. For SLC memories, an increased benefit is expected to be realized when programming in a predetermined word line order from the source side to the drain side of a NAND string compared to random order programming. Moreover, the techniques can be used in principle with all boosting techniques, including the SB method; however, the most benefit is expected with MLC boosting modes such as EASB and variants thereof.

Figure 14:
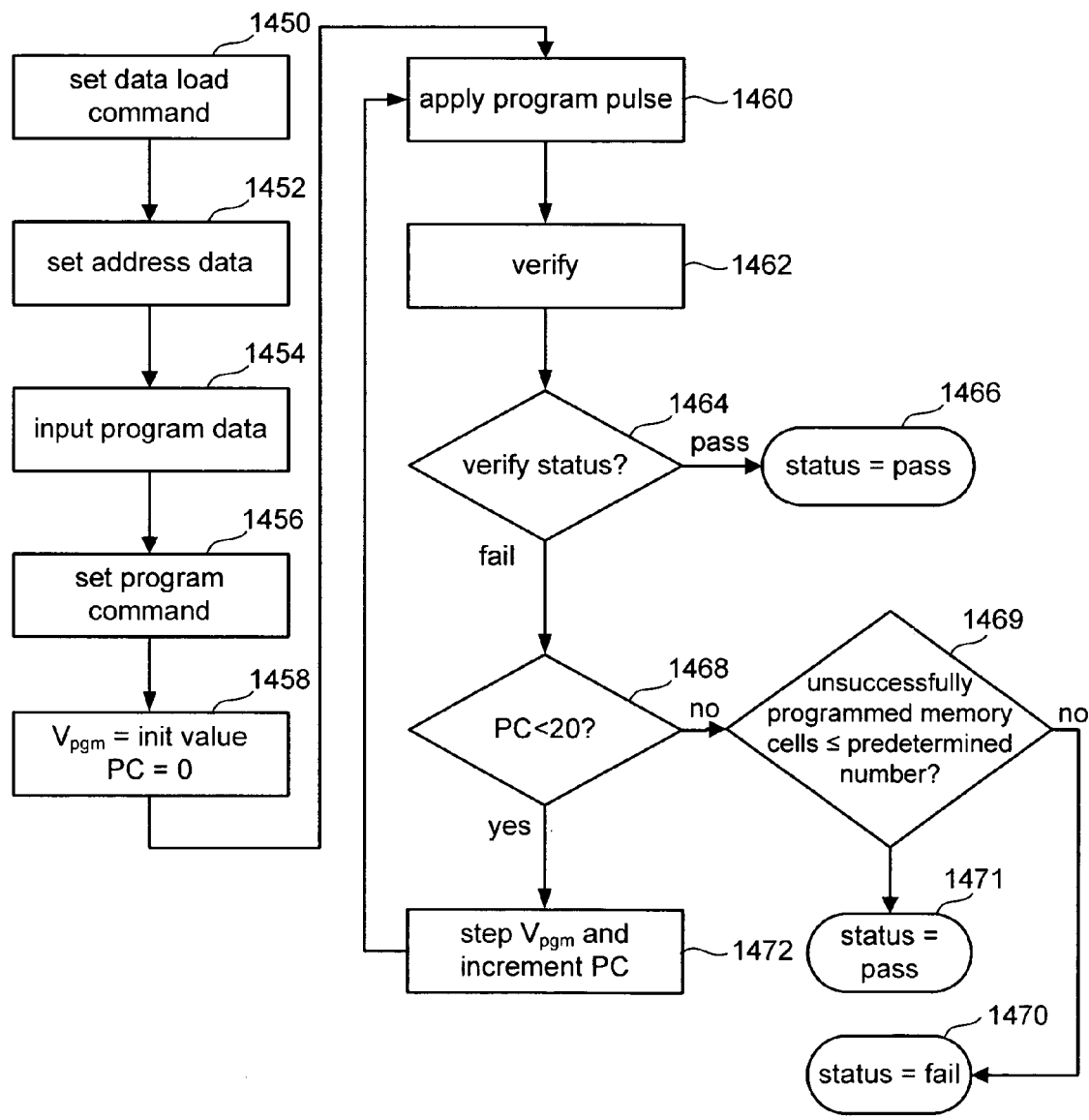
FIG. 14 is a flow chart describing one embodiment of a process for programming non-volatile memory.

FIG. 14 is a flow chart describing one embodiment of a method for programming non-volatile memory. The erase process is typically carried out on multiple word lines at the same time, while programming is done on a word line by word line basis. Memory cells can be erased in blocks or other units, for instance. At step 1450, a "data load" command is issued by controller 318 and input to command circuits 314, allowing data to be input to data input/output buffer 312 (referring also to FIG. 5). The input data is recognized as a command and latched by state machine 316 via a command latch signal input to command circuits 314. At step 1452, address data designating the page address is input to row controller or decoder 306 from the controller or host. The input data is recognized as the page address and latched via state machine 316, affected by the address latch signal input to command circuits 314. At step 1454, a page of program data for the addressed page is input to data input/output buffer 312 for programming. For example, 532 bytes of data could be input in one embodiment. That data is latched in the appropriate registers for the selected bit lines. In some embodiments, the data is also latched in a second register for the selected bit lines to be used for verify operations. At step 1456, a "program" command is issued by the controller and input to data input/output buffer 312. The command is latched by state machine 316 via the command latch signal input to command circuits 314.

Triggered by the "program" command, the data latched in step 1454 will be programmed into the selected memory cells controlled by state machine 316 using stepped pulses applied to the appropriate word line. At step 1458, $V_{pgm}$, the programming pulse voltage level applied to the selected word line, is initialized to the starting pulse (e.g., 12 V) and a program counter PC maintained by state machine 316 is initialized at 0. The magnitude of the initial program pulse can be set, e.g., by properly programming a charge pump. At step 1460, the first $V_{pgm}$ pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 1462, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 1464, it is checked whether all of the data latches are storing logic "1." If so, the programming process is complete and successful because all selected memory cells were programmed and verified to their target states. A status of "PASS" is reported at step 1466.

Optionally, a pass can be declared at step 1464 even when some of the memory elements have not yet reached their desired state. Thus, even if a certain number of cells can not reach the desired state, programming can stop before the maximum number of loops is reached.

If, at step 1464, it is determined that not all of the data latches are storing logic "1," then the programming process continues. At step 1468, the program counter PC is checked against a program limit value. One example of a program limit value is 20, however, other values can be used in various implementations. If the program counter PC is not less than 20, then it is determined at step 1469 whether the number of bits that have not been successfully programmed is equal to or less than a predetermined number. If the number of unsuccessfully programmed bits is equal to or less than the predetermined number, then the programming process is flagged as passed and a status of pass is reported at step 1471. The bits that are not successfully programmed can be corrected using error correction during the read process. If however, the number of unsuccessfully programmed bits is greater than the predetermined number, the program process is flagged as failed and a status of fail is reported at step 1470. If the program counter PC is less than 20, then the $V_{pgm}$ level is increased by the step size and the program counter PC is incremented at step 1472. After step 1472, the process loops back to step 1460 to apply the next $V_{pgm}$ pulse.

The flowchart depicts a single-pass programming method as can be applied for binary storage. In a two-pass programming method as can be applied for multi-level storage, for example, multiple programming or verification steps may be used in a single iteration of the flowchart. Steps 1458-1472 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state. At the end of a successful program process, the threshold voltages of the memory cells should be within one or more distributions of threshold voltages for programmed memory cells or within a distribution of threshold voltages for erased memory cells.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage system, comprising:
a set of non-volatile storage elements; and
one or more managing circuits in communication with the set of non-volatile storage elements, the one or more managing circuits receive a request to program data, and, responsive to the request: (a) program a selected non-volatile storage element in the set by applying a programming voltage on a selected word line, (b) during the programming, apply a first voltage to at least a first word line which is associated with a previously programmed non-volatile storage element in the set to boost a potential of a first associated channel region, and applying a second voltage to at least a second word line which is associated with an unprogrammed and/or partly programmed non-volatile storage element in the set to boost a potential of a second associated channel region, the first voltage being greater than the second voltage, and (c) during the programming, form an isolation region between the first and second associated channel regions by applying third through fifth voltages to third through fifth word lines, respectively, that are between the selected word line and the at least a first word line, the fourth word line being between the third and fifth word lines, the third through fifth voltages being less than the first voltage, and the fourth voltage being less than the third and fifth voltages.

2. The non-volatile storage system of claim 1, wherein:
the first voltage is greater than the second voltage by approximately two to three volts.

3. The non-volatile storage system of claim 1, wherein:
the first associated channel region is a source side channel region, and the second associated channel region is a drain side channel region.

4. The non-volatile storage system of claim 1, wherein:
the set is programmed staffing from a source side of the set and ending at a drain side of the set, the at least a first word line comprises a source side word line and the at least a second word line comprises a drain side word line.

5. The non-volatile storage system of claim 1, wherein:
the fourth voltage is approximately 0-1 Volts.

6. The non-volatile storage system of claim 1, wherein:
the third and fifth voltages are approximately equal.

7. The non-volatile storage system of claim 1, wherein:
the third voltage is greater than the fourth voltage.

8. The non-volatile storage system of claim 1, wherein:
during the programming, the first voltage is applied to a first plurality of adjacent word lines which are associated with previously programmed non-volatile storage elements in the set, and the second voltage is applied to a second plurality of adjacent word lines which are associated with unprogrammed and/or partly programmed non-volatile storage elements in the set.

9. The non-volatile storage system of claim 1, wherein:
the non-volatile storage elements comprise multi-level storage elements.

10. The non-volatile storage system of claim 1, wherein:
the set of non-volatile storage elements comprises a NAND string.

11. A non-volatile storage system, comprising:
a set of non-volatile storage elements; and
one or more managing circuits in communication with the set of non-volatile storage elements, the one or more managing circuits receive a request to program data, and, responsive to the request: (a) programming a selected non-volatile storage element in the set by applying a programming voltage on a selected word line, and (b) during the programming, applying a first voltage to at least a first word line associated with a previously programmed non-volatile storage element in the set to boost a potential of a first associated channel region, applying a second voltage to at least a second word line associated with an unprogrammed and/or partly programmed non-volatile storage element in the set to boost a potential of a second associated channel region, and applying third through seventh voltages to third through seventh adjacent word lines, respectively, which are associated with previously programmed non-volatile storage elements in the set, and which are between the at least a first word line and the selected word line, to form an isolation region between the first and second associated channel regions, the fifth word line is between the fourth and sixth word lines, the fourth and sixth word lines are between the third and seventh word lines, the third through seventh voltages are less than the first voltage, the fifth voltage is less than the fourth and sixth voltages, and the sixth voltage is less than the seventh voltage.

12. The non-volatile storage system of claim 11, wherein: the third voltage is greater than the fourth voltage.

13. The non-volatile storage system of claim 11, wherein: the third and seventh voltages are greater than the fourth and sixth voltages.

14. The non-volatile storage system of claim 11, wherein: the fourth and sixth voltages are approximately equal; and the third and seventh voltages are approximately equal.

15. The non-volatile storage system of claim 11, wherein: the first voltage is greater than the second voltage by an amount which is sufficient to reduce leakage of charge from the second associated channel region to the first associated channel region.

16. The non-volatile storage system of claim 11, wherein: the first voltage is greater than the second voltage by approximately two to three volts.

17. The non-volatile storage system of claim 11, wherein: the at least a first word line and the third through seventh word lines are on a source side of the selected word lines and the at least a second word line is on a drain side of the selected word line.

18. The non-volatile storage system of claim 11, wherein: the set is programmed starting from a source side of the set and ending at a drain side of the set.

19. The non-volatile storage system of claim 11, wherein: the first associated channel region is a source side channel region, and the second associated channel region is a drain side channel region.

20. The non-volatile storage system of claim 11, wherein: the non-volatile storage elements comprise multi-level storage elements.

21. The non-volatile storage system of claim 11, wherein: the set of non-volatile storage elements comprises a NAND string.

* * * * *

UNITED STATES PATENT AND TRADEMARK OFFICE
CERTIFICATE OF CORRECTION

PATENT NO.        : 7,355,888 B2
APPLICATION NO. : 11/312925
DATED             : April 8, 2008
INVENTOR(S)       : Hemink Page 1 of 1

It is certified that error appears in the above-identified patent and that said Letters Patent is hereby corrected as shown below:

Col. 20, line 19: after "programmed" and before "from" delete "staffing" and substitute therefore --starting--.

Signed and Sealed this

Nineteenth Day of August, 2008

JON W. DUDAS
*Director of the United States Patent and Trademark Office*